United States Patent
Wu et al.

(10) Patent No.: US 8,395,903 B1
(45) Date of Patent: Mar. 12, 2013

(54) INTERCONNECT PATTERN FOR SEMICONDUCTOR PACKAGING

(75) Inventors: Paul Ying-Fung Wu, Saratoga, CA (US); Richard L. Wheeler, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1678 days.

(21) Appl. No.: 11/352,035

(22) Filed: Feb. 10, 2006

(51) Int. Cl.
*H05K 7/00* (2006.01)

(52) U.S. Cl. ........ 361/777; 361/706; 361/760; 174/534; 326/38; 326/39; 326/41; 29/829

(58) Field of Classification Search .................. 361/777, 361/706, 760; 326/38, 39, 41; 29/829; 174/534
See application file for complete search history.

(56) References Cited

U.S. PATENT DOCUMENTS

| | | | | |
|---|---|---|---|---|
| 5,691,949 | A * | 11/1997 | Hively et al. | 365/230.03 |
| 5,740,069 | A * | 4/1998 | Agrawal et al. | 716/16 |
| 5,817,533 | A * | 10/1998 | Sen et al. | 438/4 |
| 5,883,525 | A * | 3/1999 | Tavana et al. | 326/39 |
| 6,175,158 | B1 * | 1/2001 | Degani et al. | 257/777 |
| 6,198,635 | B1 * | 3/2001 | Shenoy et al. | 361/760 |
| 6,396,136 | B2 * | 5/2002 | Kalidas et al. | 257/691 |
| 6,567,969 | B1 * | 5/2003 | Agrawal et al. | 716/17 |
| 6,738,279 | B1 * | 5/2004 | Kablanian | 365/72 |
| 6,762,366 | B1 | 7/2004 | Miller et al. | |
| 6,875,921 | B1 * | 4/2005 | Conn | 174/534 |
| 7,095,107 | B2 | 8/2006 | Ramakrishnan et al. | |
| 7,122,751 | B1 * | 10/2006 | Anderson et al. | 200/85 R |
| 7,138,820 | B2 * | 11/2006 | Goetting et al. | 326/9 |
| 7,233,168 | B1 * | 6/2007 | Simkins | 326/38 |
| 7,239,173 | B1 * | 7/2007 | Voogel | 326/38 |
| 7,345,507 | B1 * | 3/2008 | Young et al. | 326/41 |
| 7,501,341 | B1 * | 3/2009 | Von Herzen | 438/666 |
| 2005/0077634 | A1 * | 4/2005 | Seaman et al. | 257/786 |

OTHER PUBLICATIONS

U.S. Appl. No. 11/123,526, filed May 5, 2005, Von Herzen.
Wheeler, Richard, "Switching Noise in VLSI Packages," pp. 1-28, downloaded on May 4, 2005 from http://www.wheeler.com/technology/vlsipresentation1/index.htm (1 of 2) [Dec. 17, 2001 6:11:28 PM].
Wheeler, Richard, "Modeling Simultaneous Switching Noise (SSO) in the X-axis Direction of VLSI Packages and PCB's," pp. 1-50, downloaded on May 4, 2005 from http://www.wheeler.com/technology/vlsipresentation2/index.htm (1 of 3) [Dec. 17, 2001 6:13:12 PM].

* cited by examiner

*Primary Examiner* — Xiaoliang Chen
(74) *Attorney, Agent, or Firm* — Scott Hewett; Michael T. Wallace (57) ABSTRACT

An interconnect array uses repeated application of an interconnect pattern ("tile"). The tile has eight I/O signal pins forming a perimeter array, a central pin that can be either a ground pin or an I/O power pin, and an offset ground pin. The I/O signal pins are associated with the same or multiple I/O banks. If the central pin is an I/O power pin, it is optionally associated with an I/O bank associated with one or more of the I/O signal pins.

5 Claims, 7 Drawing Sheets

INTERCONNECT PATTERN FOR SEMICONDUCTOR PACKAGING

FIELD OF THE INVENTION

One or more aspects of the invention relate generally to interconnect pinout patterns for IC packaging and, more particularly, to an interconnect array formed at least in part using a repeated application of an interconnect pattern.

BACKGROUND OF THE INVENTION

As integrated circuits have become more complex employing more and more pins in a limited area, mutual inductance between pins has increased. In fact, a complex integrated circuit die is conventionally coupled to a significantly larger package to couple such integrated circuit die to a printed circuit board ("PCB"), as the pin density of such die may be too great to directly couple the die to the PCB.

Interconnect arrays are laid out in a pattern selected to reduce power/ground loop inductance by minimizing the "loop" between I/O pins and power or ground pins. One type of pattern used to avoid power/ground loops is known as a "checkerboard pattern" of pins. A checkerboard pattern of pins alternates power and ground pins to reduce mutual inductance; however, the checkerboard pattern leaves no pins for I/O signals.

Accordingly, it would be desirable and useful to provide a pinout with low loop inductance and increased signal pin density.

SUMMARY OF THE INVENTION

One or more aspects of the invention relate generally to interconnects and, more particularly, to an interconnect array formed at least in part using a repeated application of an interconnect pattern.

An interconnect array uses at least in part a repeated application of an interconnect pattern ("tile"). The tile has eight I/O signal pins forming a perimeter array, a central pin that can be either a ground pin or an I/O power pin, and an offset ground pin. The I/O signal pins are associated with the same or multiple I/O banks. If the central pin is an I/O power pin, it is optionally associated with an I/O bank associated with one or more of the I/O signal pins.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

There are many types of complex integrated circuits for which mutual inductance may be closely linked with pin density. General categories of these complex integrated circuits may include system-on-chip, processors, application specific integrated circuits ("ASICs"), and application specific standard products, among others. The terms "include" and "including" as used herein mean including without limitation. Examples of such integrated circuits include microprocessors, digital signal processors, communication integrated circuits including framers and cross-connects, programmable logic devices, memories, and graphic signal processors. One type of programmable logic device is a Field Programmable Gate Array ("FPGA").

Interconnection ("pinout") patterns for IC's are often described in terms of the number of I/O pins to the ground and power pins. It is often desirable to provide a large number of I/O pins in an FPGA to allow flexibility in user application. FPGAs often have several transceivers and other ports and it is desirable to not unduly limit how a user can configure the FPGA. Other types of ICs are often designed for a pre-determined interface and use a pin ratio of 6:1:1, which means a tile (a repeating pattern) of the interconnection pattern has six I/O pins, one power pin, and one ground pin. It is desirable to provide an interconnect pattern with higher I/O ratio for use with FPGAs.

It is generally desirable to minimize "inductance loops" in a packaged IC. An inductance loop is a current loop that has an undesirably high inductance, which can slow down operation of an IC. Inductance loops can form between ground pins and I/O pins, power pins and I/O pins, and power pins and ground pins. Generally, the closer together pins are, the lower the inductance between them. A conventional approach is to provide a "checkerboard" of I/O, ground, and power pins. However, this is inefficient because one usually does not need so many power pins, and provides a relatively low ratio of I/O pins.

Figure 1:
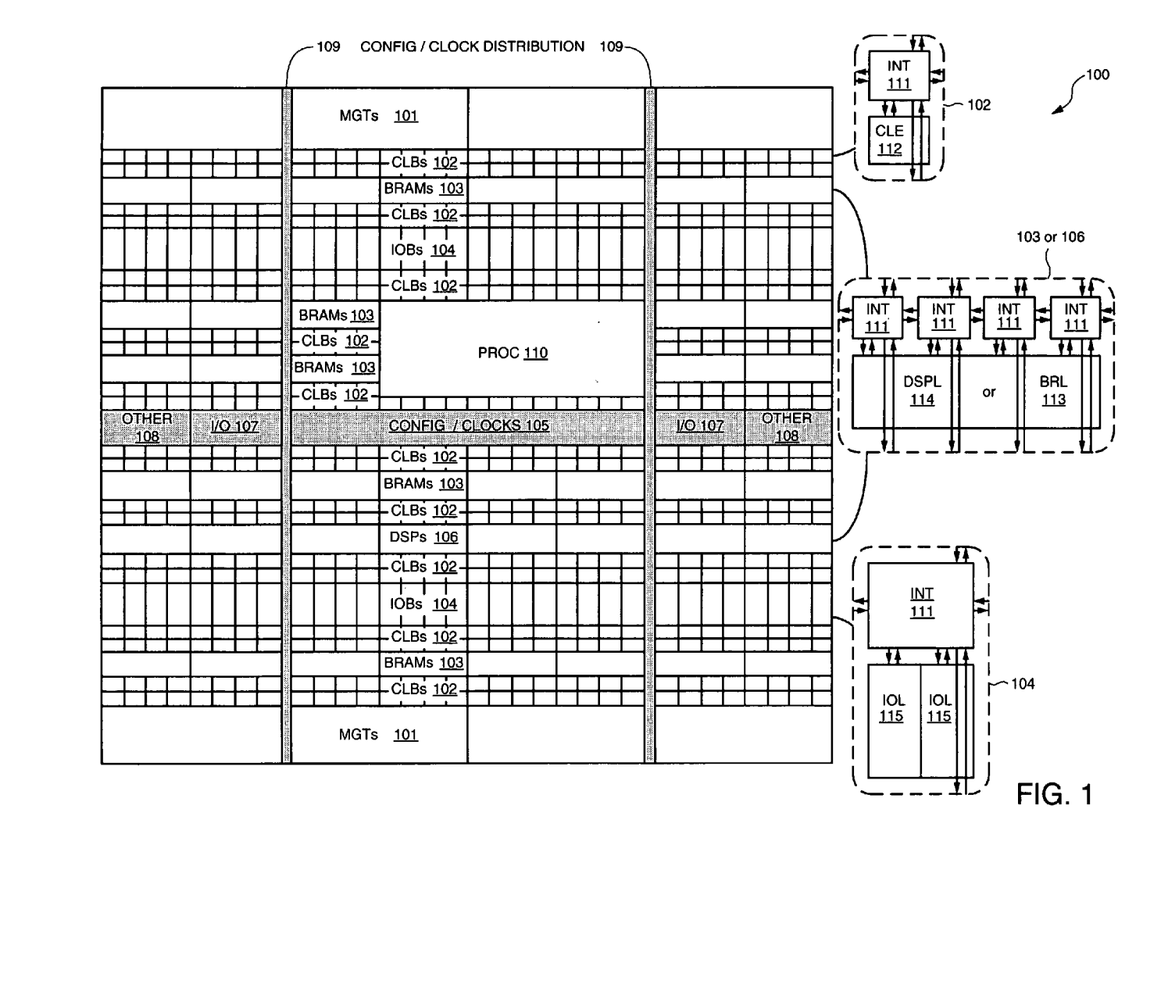
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1. In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic.

FPGA 100 may be a VIRTEX-4™ FPGA from XILINX, INC. of San Jose, Calif. FPGA 100 may have a pinout formed at least in part by repeated application of an interconnect pattern as described below herein in additional detail.

Figure 2:
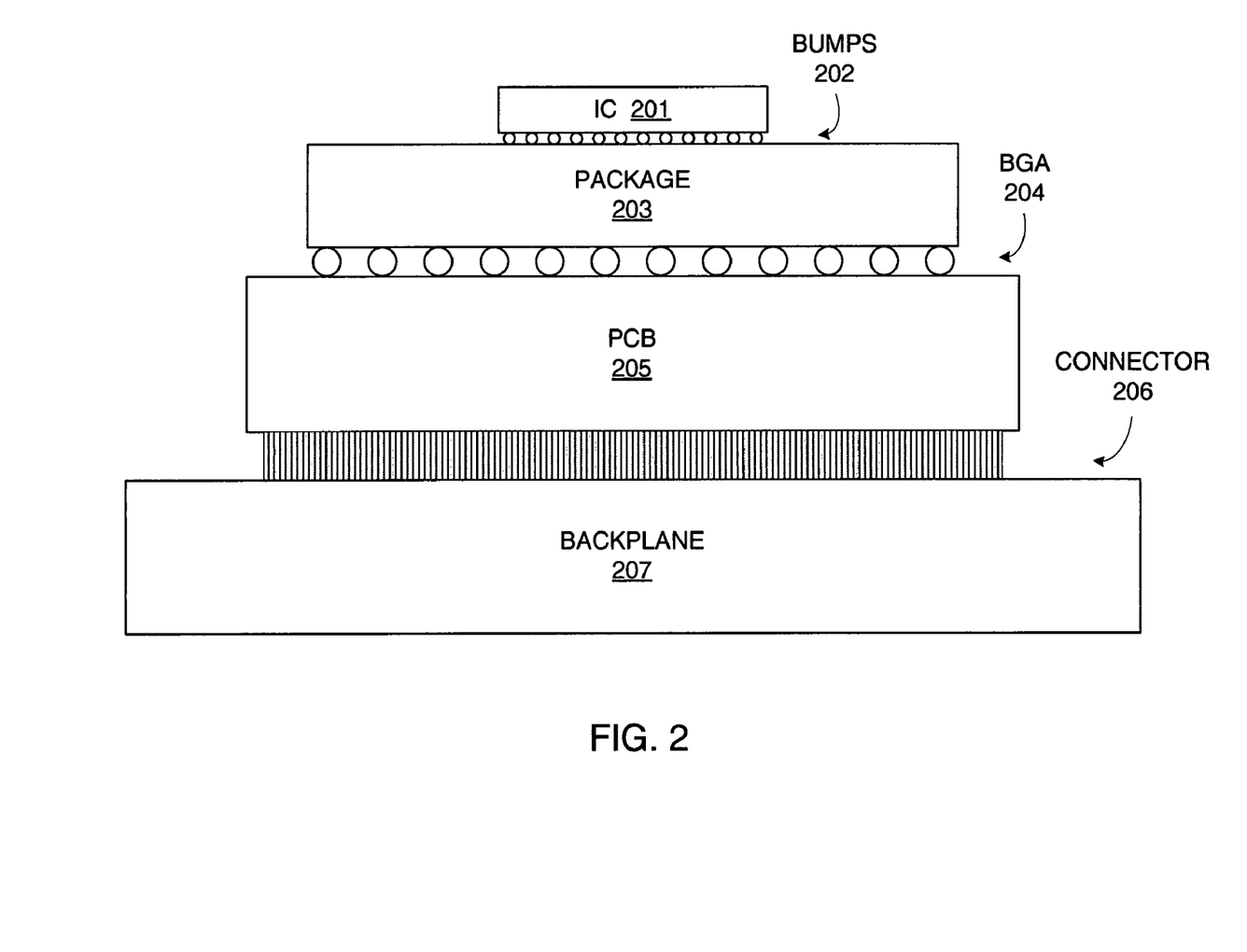
FIG. 2 is a high-level side view depicting an exemplary embodiment of a package coupling an integrated circuit to a printed circuit board.

FIG. 2 is a high-level side view depicting an exemplary embodiment of a package 203 coupling an integrated circuit ("IC") 201 to a printed circuit board ("PCB") 205. IC 201 may be FPGA 100 of FIG. 1 or other known complex IC. Although FIG. 2 specifically identifies different types of interconnect arrays, such as solder bumps 202, ball grid array ("BGA") 204 and connector 206, it should be understood that any one of these types of interconnect arrays, or any combination of two or more of these interconnect arrays, may be formed in whole or in part using repeated application of an interconnect pattern as described herein.

IC 201 is coupled to package 203 via solder bumps 202. Solder bumps 202 may be configured or otherwise laid out using repeated application of an interconnect pattern. More particularly, in an embodiment an asymmetric tile may be used to provide a layout of interconnect locations, as described below in additional detail. By asymmetric tile, it is meant that perimeter of the tile is irregular, though two symmetrical tiles may be used to form the perimeter of the asymmetric tile. In the example below, a 3×3 tile and a 1×1 tile in combination form the asymmetric tile and thus the perimeter of the asymmetric tile. Package 203, which may be made of an organic or inorganic material as is known, is coupled to PCB 205 via BGA 204. BGA 204 may be a fine-pitch BGA. BGA 204 may be laid out in accordance with tiling with a tile, as described herein below in additional detail. PCB 205 may be a line card or daughter card coupled to a backplane, motherboard, or other larger PCB 207 via connector topology 206. Connector topology 206 may be configured using one or more tiles as described below herein in additional detail. Moreover, it should be appreciated that a multi-chip module can be coupled to a PCB using one or more tiles for connector topology. Furthermore, a PCB-to-mezzanine card application may be coupled using a connector topology having one or more tiles.

Though the above description with reference to FIG. 2 has been in terms of solder bumps 202, BGA 204, and connector topology 206, it should be understood that a tile as described herein may be used with other types of connectors for communicating information. Examples of other types of connectors include optical connectors. Moreover, it should be appreciated that although a tile as described herein is used with flip-chip technology, a wirebond or other known interconnect technology may be used. Furthermore, although an example of a BGA is used, it should be understood that other connector technologies, including land grid array ("LGA") and column grid array ("CGA"), among other known connector technologies, may be used.

Figure 3:
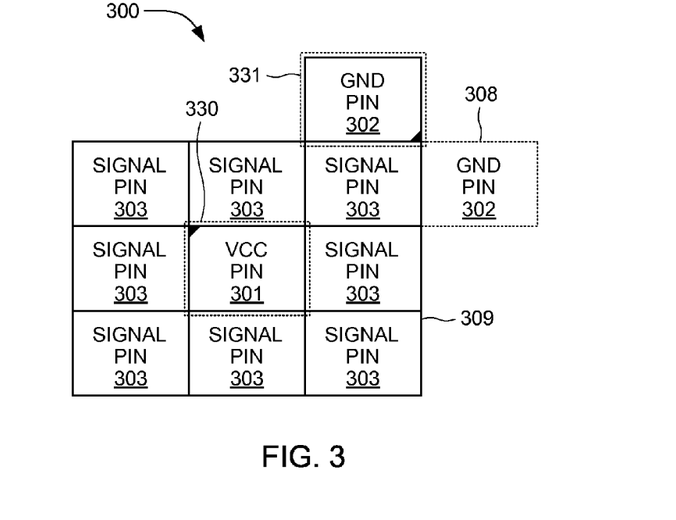
FIG. 3 is a block layout diagram depicting an exemplary embodiment of a tile.

FIG. 3 is a block layout diagram depicting an exemplary embodiment of a tile 300. In this embodiment, tile 300 is an asymmetric tile, which in this exemplary embodiment includes a "center" connectivity location 301, which is either a power connectivity location or a ground connectivity location, surrounded by eight signal connectivity locations 303 and having a ground connectivity location external to the eight signal connectivity locations 303. The center connectivity location 301 is generally in a middle region 330 with respect to signal connectivity locations 303. A ground connectivity location 302 is generally in an offset region 331 external and adjacent to a perimeter of array 309, or more particularly to a perimeter of eight signal connectivity locations 303. An example of FIG. 3 can be found in co-pending, commonly assigned U.S. patent application Ser. No. 11/123, 526, entitled "Interconnect Array Formed At Least In Part With Repeated Application Of An Interconnect Pattern", by Brian Von Herzen, filed May 5, 2005, which is herein incorporated by reference.

For purposes of clarity by way of example and not limitation, these connectivity locations shall be hereinafter referred to as "pins." Moreover, by way of example and not limitation, a power pin can provide Vcc, internal Vcc ("$V_{CCINT}$," also known as $V_{dd}$), auxiliary $V_{CC}$ ("$V_{CCAUX}$," also known as $V_A$), $V_{CCO}$, $V_{ddIO}$ or other power supply. For purposes of convenient discussion, a power pin will generally be referred to as a "Vcc pin," regardless of what actual power (e.g., $V_{CCINT}$, $V_{CCAUX}$) is provided by the pin.

The tile 300 has no power connectivity location in embodiments where the center connectivity location 301 is a ground connectivity location. This is achieved by "borrowing" power from an adjacent tile in an interconnect pattern made of repeated tiles. More particularly, a "bank" of pins has a particular number of associated I/O pins. I/O pins are often connected to a transmission line in the package/IC having a characteristic impedance of fifty ohms, for example, which is desirable to transmit high-frequency signals (generally, signals greater than 200 MHz). In some conventional ICs, banks have sixty-four I/O pins, in others, such as some FPGAs, the number of I/Os per bank is variable. Embodiments of the invention allow banks to have a number of I/O pins not equal to sixty-four, such as banks having twenty or forty I/O pins, while maintaining a high I/O:power:ground ratio. This provides increased design flexibility, which is especially desirable in configurable ICs, such as FPGAs, and in custom ICs, such as ASICs.

Power pins and ground pins are often connected to low-impedance lines so as to avoid power droop and signal distortion, such as slower rise time or duty cycle distortion. Fortunately, while I/O paths have to support very high data rates, often up to several gigahertz (GBps), power and ground paths, which operate essentially at zero hertz ("DC"), do not. Alternating current ("AC") shunts that do not conduct DC are used to provide a low-impedance path for high-frequency signals between power and ground pins between tiles. For example, a capacitor having a capacitance between about 0.10 micro-Farads and about 2.2 micro-Farads between a power pin and a ground pin allows the center connectivity location 301 to be either a power pin or a ground pin by providing a low-impedance path from the signal pins 303 to a power pin in a different tile within the I/O bank.

Suitable capacitors are fabricated in package 203 shown in FIG. 2, for example. In a particular embodiment, a 0.68 micro-Farad capacitor is formed in the package between a first center connectivity location that is a ground pin in a first tile within an I/O bank and a second center connectivity location in a second tile within the I/O bank. In a particular embodiment, the first tile is adjacent to the second tile within the I/O bank, and the second center connectivity location is a power pin within the same I/O bank as the first tile. Alternatively, the second center connectivity location is in a different I/O bank than the first tile. This provides an AC reference to both power and ground for the I/O pins in the tile. It is not necessary that an AC reference to both power and ground for the I/O pins come from the same tile, or even from the same I/O bank.

Connectors other than pins may be laid out in accordance with one or more of tiles 300. Tile 300 is a tile that is capable of tiling a plane area, which may be applied where one tile is offset from another tile for repeated application to tile an area. Notably, there may be boundary conditions for a finite plane, where the interconnect pattern of tile 300 is not maintained or is truncated, as described below in additional detail. Providing a central connectivity location that can be either a ground pin or a power pin provides greater flexibility in filling a plane area with tiles. Similarly, there is greater flexibility in defining the shape of a bank boundary within the plane area. This provides additional advantages, such as a reduced layer count on a system board.

Pins 303 surround pin 301 forming an array 309, which is a portion of tile 300. Array 309, for purposes of clarity by way of example and not limitation, may be thought of as a square or a rectangle. An additional pin, such as a ground pin 302, is part of tile 300 and is located adjacent to, though external to, perimeter array 309. Ground pin 302 may be located at any of eight possible corner locations around the square or rectangular perimeter array of the tile. The tile is then repeated over and over ("stepped") to define portions of the pinout array.

For example, an alternative location of ground pin 302 is illustratively shown with a dashed box 308 in FIG. 3. Thus, in this example, a complete tile 300 consists of 10 pins, and such tile 300 has a pattern associated with the location of a central pin to peripheral signal pins and with the location of a ground pin to corner signal pins. Tile 300 in this example has a signal-to-power/ground ratio of eight-to-two ("8:2"). If the central connectivity location 301 is a power pin, than the tile 300 has a signal-to-power-to-ground ratio of eight-to-one-to-one.

Tile 300 when put together with other such tiles 300 may be used to fill a plane to provide a pinout array, or a portion of a pinout array. Tiles are often combined to form a step pattern (see FIG. 4), which is a pattern of tiles that is stepped in a convenient fashion.

By maintaining an 8:2 ratio, inductance of signal pins 303 next to central pin 301 and ground pin 302 may be maintained at or below a threshold value, sometimes referred to as a worst-case inductance value. Notably, the percentage of decrease in inductance from a nominal value for an array scales according to pitch of the array. Though there are many more refined equations for determining mutual inductance ("MI"), a first order approximation may be obtained from Equation (1):

$$MI = L*h^2/(s^2+h^2) \qquad (1)$$

where "s" is the distance between pins, "h" is the distance to a ground plane, and "L" is inductance. For simplicity, "h" may be assumed to be the distance to a ground pin. By using the tile 300, mutual inductance to ground pin 302 and central pin 301 from signal pins is minimized. For example, if all signals in a bank transition to either a logic high or logic low level on the same clock cycle, then such reduction in mutual inductance may be approximately one half that of a traditional FPGA pinout array architecture, which may have signal pins that are several millimeters (i.e., several pitch/grid steps) away from a ground pin.

Keeping signal pins within one pitch/grid distance of the ground pin 302 or the central pin 30 enhances stability. For example, simultaneous switching noise ("SSN") may be reduced in comparison to a traditional FPGA pinout array architecture. More particularly, distance of signal pins from ground pin 302 and central pin 301 may be controlled with tiling to reduce ground bounce and Vcc bounce due to simultaneous switching events. Simultaneous switching events, and more particularly a subset of SSN, includes simultaneous switching output ("SSO").

Figure 4:
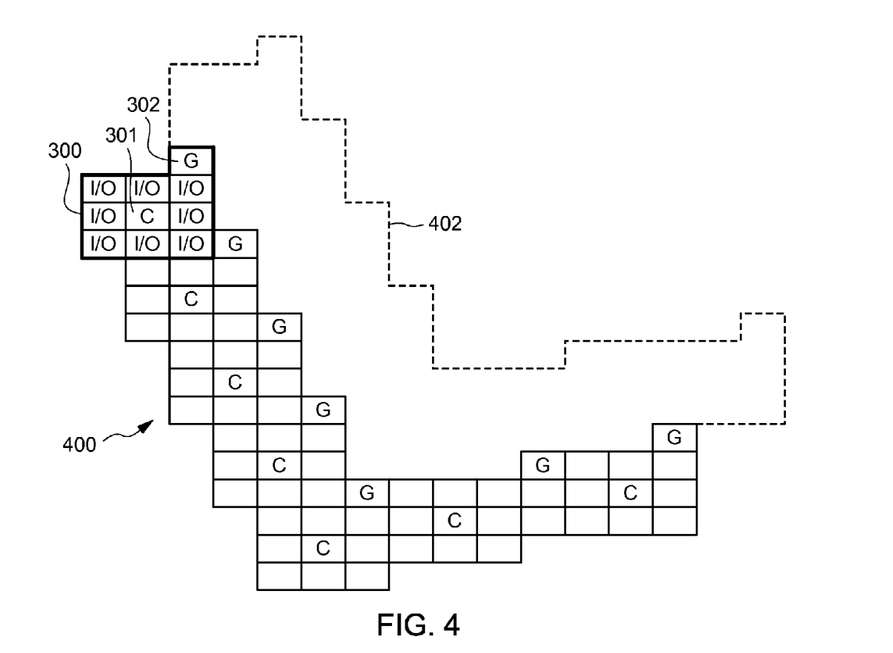
FIG. 4 is a pinout diagram depicting an exemplary embodiment of a pinout array formed using repeated application of the tile of FIG. 3.

FIG. 4 is a step pattern 400 according to an embodiment. The step pattern 400 is made up of seven ten-pin tiles 300, as are illustrated in FIG. 3. In tile 300, the central connectivity location 301, which may be either a power pin or a ground pin, is indicated with a "C," the ground pin 302 is indicated with a "G," and the I/O (signal) pins are indicated with "I/O." In the other six tiles of the step pattern, only the ground and center pins are indicated, for simplicity of illustration. The step pattern 400 is moved across a two-dimensional grid having a regular pitch, such as 1 mm between pins. The step pattern is repeated across the grid to fill in a plane area (e.g., a block) of a pinout array of an IC package. The step pattern is moved in two orthogonal directions, such as three grid steps to the right and one grid step up, as shown by the dashed line 402, to fill in a pinout array of an IC or IC package.

At least three important advantages arise from the tile 300 having a center connectivity location that can be either a ground pin or a power pin. First, a higher ratio of I/O:power:

ground pins can be achieved. Similar tiles, in which the center connectivity location is restricted to a power pin, results in more power pins in a bank than may be necessary. In a particular pinout array for an FPGA, a 10% increase in the number of I/O pins was achieved using an embodiment of the invention, compared to a similar pinout array wherein the central pin of a tile similar to FIG. 3 was restricted to a power pin.

Second, allowing the center connectivity location of a tile to be either a ground pin or a power pin, including a power pin from a different I/O bank, provides greater freedom in defining both the size and the shape of I/O banks in a pinout array. The tiles can be configured so that I/O pins from multiple banks are within a single tile, for example, or that the center connectivity location can be a power pin "borrowing" power from another I/O bank, even from an I/O bank that does not have an associated I/O pin in the tile.

Third, it allows power pins, other than those providing I/O bank power, to be arranged in a central checkerboard pattern with ground pins. This is desirable because it concentrates the low-impedance routes through the package in the center of the package, which is typically below the IC. In other words, the IC "footprint" overlies the checkerboard pattern. Each power pin in the checkerboard pattern is "surrounded" by four ground pins, which lowers the inductance loop by essentially providing four parallel ground return paths. Providing power/ground pins in a checkerboard pattern avoids power droop by reducing loop inductance of power/ground pins.

Figure 5A:
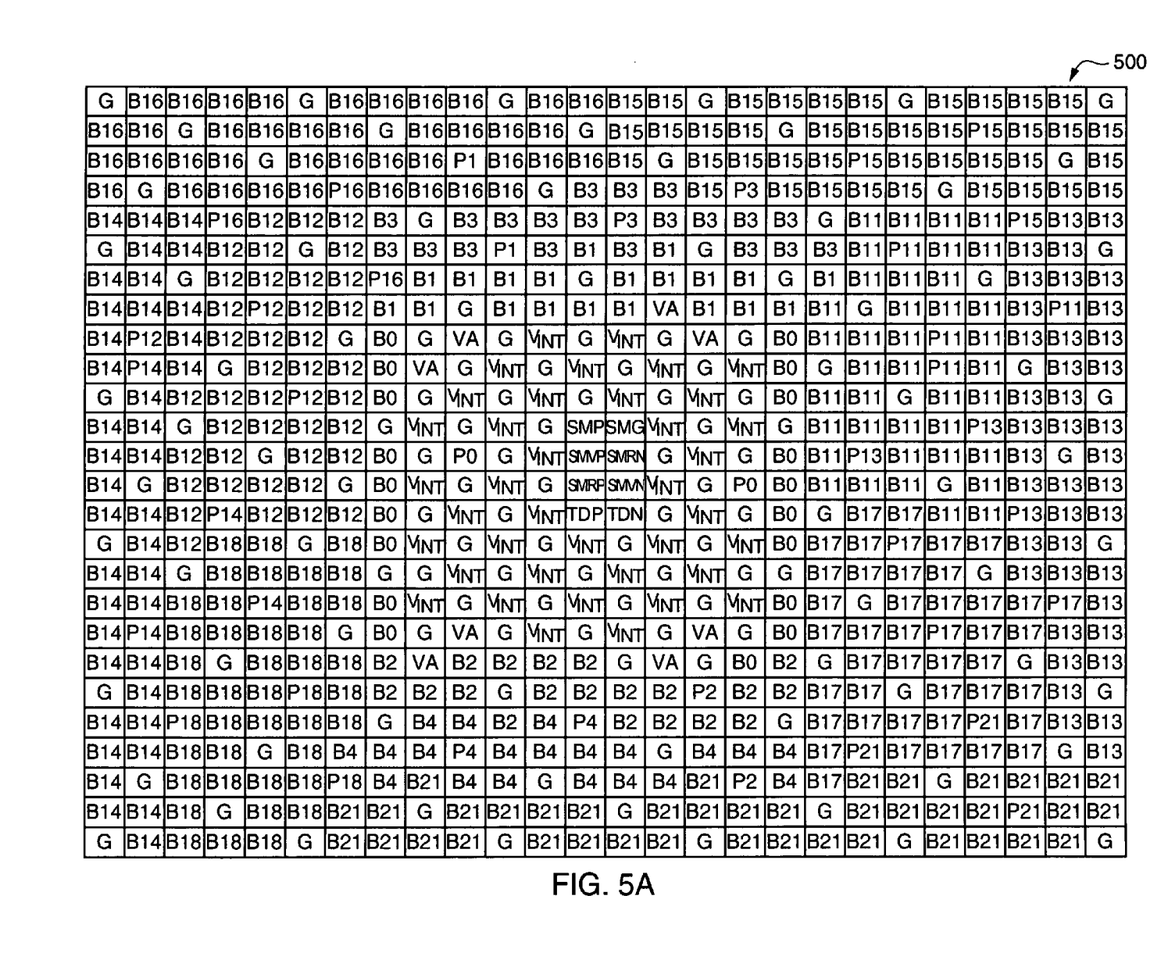
FIGS. 5A, 5B, and 5C are high-level pinout diagrams depicting respective exemplary embodiments of a pinout array using repeated application of the tile of FIG. 3.

FIG. 5A is a diagram of a pinout array 500 according to an embodiment of the invention. The pinout array 500 is used in an IC package (see FIG. 2, FIG. 203) that interfaces between an IC and a PCB. Alternatively, the pinout array is used in an IC or a PCB. For purposes of illustration only, the diagram shows the pinout array of an IC package as it would be viewed from the "bottom" (i.e., the side interfacing with the PCB, ref. FIG. 2, nums. 201, 202, 203, 204). The pinout array 500 is a 26-by-26-pin (26×26) grid. The 676 pins of the grid are arranged in a periodic fashion with a selected pitch (spacing), such as about 1 mm between pin centers. The pinout array 500 is shown as being rectangular in order to provide sufficient area for labeling. In a particular embodiment, the pinout array 500 is square, with the "vertical" pitch and the "horizontal" pitch both being nominally 1 mm. Alternatively, the pinout array is implemented in a rectangular embodiment, and the "horizontal" pitch is different than the "vertical" pitch. I/O signal pins are indicated with a "B" followed by the I/O bank number (e.g., B18 for an I/O power pin in bank 18). I/O bank power pins are indicated with a "P" followed by the I/O bank number (e.g., P18). Other power pins are labeled $V_{INT}$ (for $V_{CC}$ internal) and $V_A$ (for auxiliary voltage). A block of eight pins (labeled SMP, SMG, SMRN, SMVP, SMRP, SMVN, TDP, and TDN) provide analog input functions (e.g., "system monitor").

Figure 5B:
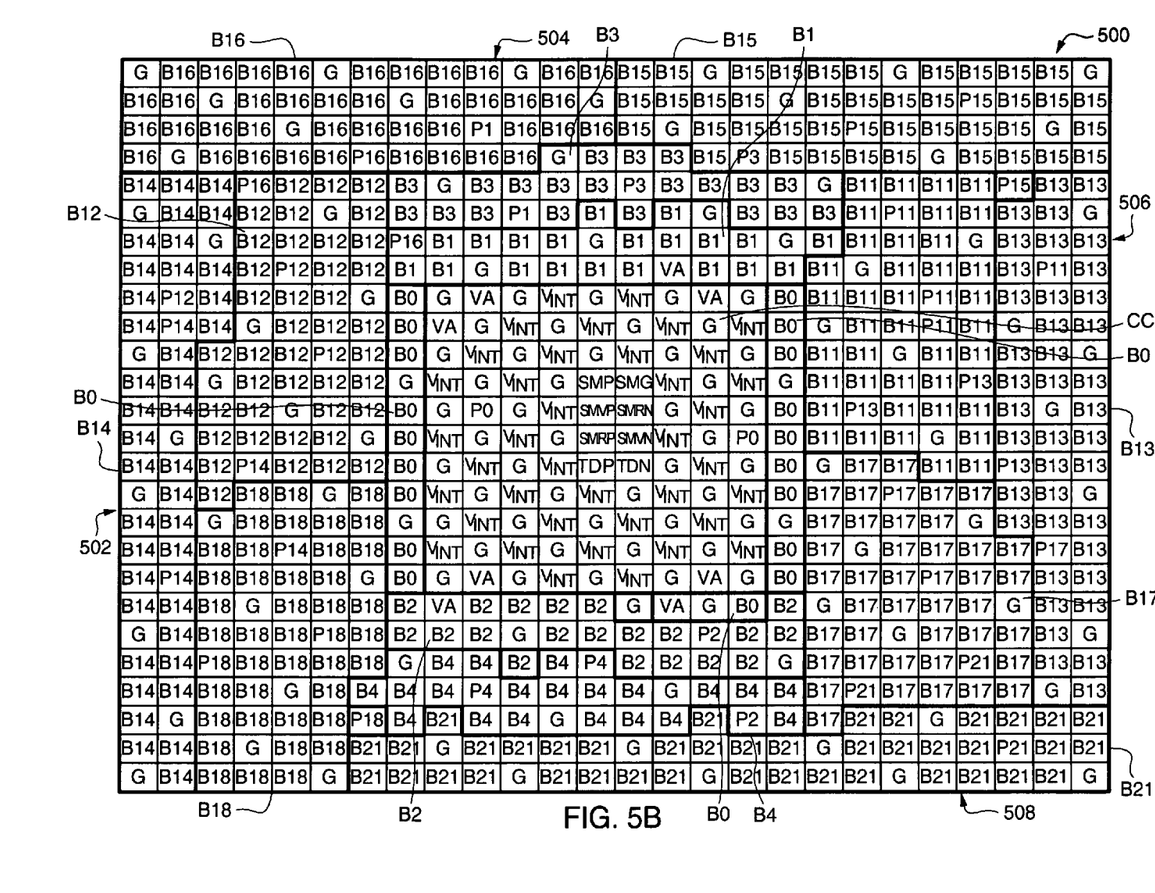

FIG. 5B shows the pinout array 500 divided into I/O banks B0, B1, B2, B3, B4, B11, B12, B13, B14, B15, B16, B17, B18, B21 and a center checkerboard section CC. The banks are defined by the I/O signal pins. Since the basic tile (see FIG. 3, ref. num. 300) is versatile with respect to the center pin, ground pins and I/O power pins are alternatively included in adjacent banks. In other words, the bank boundaries are alternatively definable. Note that it is not necessary for a bank to be contiguous (e.g., B0). Similarly, the banks may be of different sizes. For example, bank zero has nineteen I/O signal pins, banks one, two, three, and four each have twenty I/O signal pins, and the remaining banks have forty signal pins. A conventional pinout array that requires the number of I/O signal pins to be an integer multiple of eight (the number of I/O pins in a tile) can result in a lower total number of I/O pins for the entire pinout array because of the need to "round up" the number of $V_{CCO}$ pins required. Alternatively, an embodiment of the invention includes one or more I/O banks having a number of I/O pins equal to an integer multiple of eight. The central checkerboard section CC alternates non-I/O power pins with ground pins. This provides low-inductance power/ground loops.

The versatility provided by the tiles of the pinout array 500 also allow the definition of high-aspect-ratio banks (e.g., banks B14, B16, B15, B13, and B21) along the edges 502, 504, 506, 508 of the pinout array 500. This is highly desirable because it allows the PCB (see FIG. 2, ref. num. 205) designer to bring in many I/O signals of a bank into the edge of the package. A "high-aspect ratio" I/O bank has at least one-fourth of its signal I/O pins in a single row or in a single column of the pinout array. Banks B14, B16, B15, B13, and B21 have at least one-fourth of their I/O signal pins in each of two adjacent rows or in each of two adjacent columns of a pinout array. In a particular embodiment, each edge 502, 504, 506, 508 of a pinout array 500 has at least one high-aspect ratio I/O bank. That is, each row or column defining an edge of an array includes at least one-fourth of the total number of I/O signal pins in an I/O bank. This is desirable because the number of layers needed on the PCB (or system board) for routing all I/Os in the bank can be greatly reduced.

For a high-aspect-ratio I/O bank, two signal layers in the PCB may be sufficient. The signal environment is much more uniform than spreading signals in a single bank into many layers of the PCB. In some conventional applications, the PCB uses six or eight signal layers, such as when I/O banks are irregular or "deep" (extending from near the edge of the pinout array to near a central checkerboard section, like a slice of pie). Often, I/O signal lines are critical, and specially controlling the impedance of I/O signal lines in a reduced number of layers in the PCB provides cost savings.

Figure 5C:
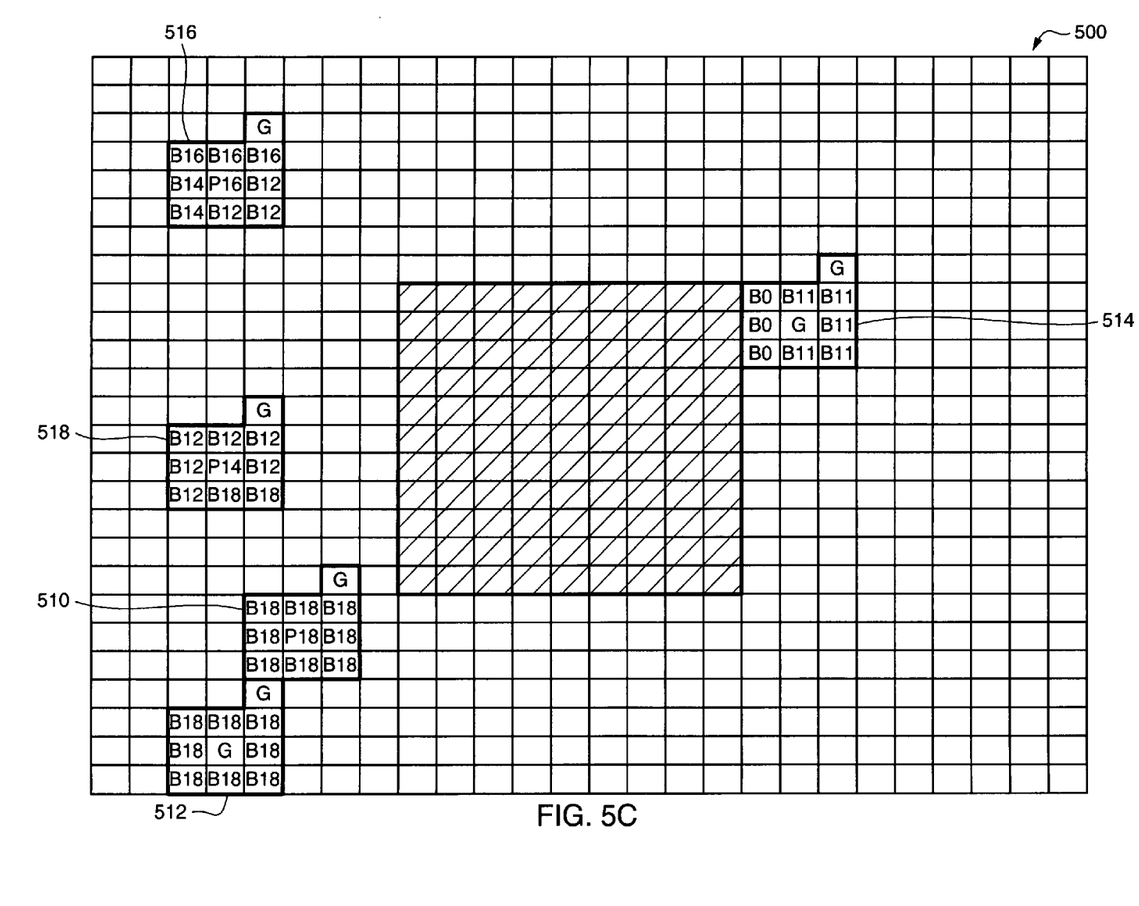

FIG. 5C shows the various tiles 510, 512, 514, 516, 518 in the pinout array 500 of FIG. 5A. Pin indicators are omitted in the remainder of the pin locations for clarity of illustration. Each tile 510, 512, 514, 516, 518 has the same basic pattern as the tile 300 shown in FIG. 3. In other words, eight I/O signal pins form an array surrounding a center ground/power pin, and a ground pin extends from a corner of the array. Tile 510 is an example of a "conventional" tile in which all of the eight I/O signal pins are associated with a single I/O bank (I/O bank eighteen), and the central connectivity location is a power pin from the same I/O bank (I/O bank eighteen). However, tiles in the pinout array are not restricted to this configuration. Tile 512 shows a tile in which all eight I/O signal pins are associated with the same I/O bank (again, I/O bank eighteen, merely by way of illustration), but the center connectivity location is a ground pin.

Tile 514 is another tile in which the center connectivity location is a ground pin, but the eight I/O signal pins are from different banks, in this case, banks zero, four, and eleven. Similarly, tile 516 has I/O signal pins from various banks (banks twelve, fourteen, and sixteen), and the center connectivity location is an I/O bank power pin associated with the same I/O bank (I/O bank sixteen) that at least one of the I/O signal pins in the tile 516 is associated with. Finally, tile 518 has I/O pins from multiple I/O banks (banks twelve and eighteen), and the center connectivity location is an I/O bank power pin that is associated from a different bank (bank fourteen) than any of the I/O signal pins in the tile 518.

With reference to FIGS. 5A, 5B, and 5C, the 8:2 ratio of a tile may be relaxed for boundary conditions, such as the edge of the pinout array or the edge of a central checkerboard region. For example, in a 26×26 grid, a tile has three pins along the bottom, which does not divide into twenty-six to provide an integer number of tiles along the bottom edge of the array. Tiles may be truncated for boundary or other conditions.

Figure 6:
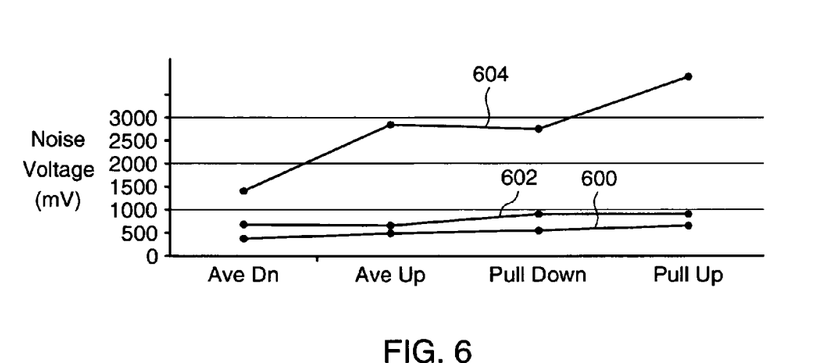
FIG. 6 shows plots of noise voltage for a pinout array according to an embodiment of the invention compared to the noise voltage for a conventional pinout array.

FIG. 6 shows plots of simulated noise voltage (maximum package switching noise) for a pinout array according to an embodiment of the invention 600 compared to the noise voltage for a conventional pinout array 604. The conventional pinout array is of a previous generation of package in which the power/ground pins are not maintained in close proximity to I/O signal pins. A third plot 602 shows the simulated noise voltage for a 6:1:1 pinout array known as SAFETY CROSS™. SAFETY CROSS™ pinout arrays have been used on IC packages by IBM, for example, and are believed to provide superior noise performance because I/O signal pins alternate with either power pins or ground pins. The proximity of such power/ground pins on either side of I/O signal pins is desirable for reducing inductance loops of the I/O signal pins. However, alternating power and ground pins with I/O signal pins results in fewer I/O signal pins in the pinout array, compared to an 8:2 embodiment of the invention.

The noise voltage 602 of the 6:1:1 SAFETY CROSS™ pinout array is slightly higher than the noise voltage 600 of the 8:2 pinout array of an embodiment of the invention. This is believed to arise because of the difference between the theoretical signal:power:ground ratios over a large-area package and the actual signal:power:ground ratios used to simulate the noise. The results show that the noise voltage of the embodiment 600 is superior to the noise voltage 604 of the conventional pinout array and is essentially the same as the noise voltage theoretically obtained with a SAFETY CROSS™ pinout array.

The package switching noise arises from a variety of events occurring in normal operation of a packaged complex IC, as discussed above in reference to FIG. 3, and the plots show the maximum package switching noise for average noise in an all pull-down switching events ("AVE DN"), average noise in an all pull-up switching event ("AVE UP"), maximum (worst case) noise in an all pull-up event ("PU"), and maximum (worst case) noise in an all pull-down event ("PD").

It is generally desirable to keep switching noise as low as possible, and FIG. 6 shows that the pinout array of the embodiment provides excellent (i.e., low) package switching noise for all events.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for providing an interconnect array pattern, comprising:
    obtaining an interconnect pattern having at least ten interconnect locations, the interconnect pattern including eight I/O signal connectivity locations forming a perimeter array surrounding a central connectivity location being a power interconnect or a ground interconnect, a ground connectivity location externally offset from the perimeter array and adjacent to one of the eight I/O signal connectivity locations to form an asymmetrically shaped interconnect pattern,
    defining a first interconnect tile according to the interconnect pattern wherein the central connectivity location is a second ground connectivity location; and
    defining a second interconnect tile according to the interconnect pattern having a second perimeter array surrounding a second central connectivity location wherein the second central connectivity location is an I/O power connectivity location associated with an I/O bank of the interconnect array pattern.

2. The method of claim 1 wherein at least one I/O signal connectivity location of the second perimeter array is an I/O signal pin associated with the I/O bank.

3. The method of claim 2 wherein a second I/O signal connectivity location of the second perimeter array is an I/O signal pin associated with a second I/O bank.

4. The method of claim 1 wherein the central connectivity location of the first interconnect tile is capacitively coupled to an I/O power pin of the I/O bank.

5. The method of claim 1 wherein a first I/O signal connectivity location of the first interconnect tile is associated with a first I/O bank of the interconnect array pattern and a second I/O signal connectivity location of the first interconnect tile is associated with a second I/O bank of the interconnect pattern.

* * * * *